United States Patent [19]

Walowit et al.

[11] Patent Number: 5,015,277
[45] Date of Patent: May 14, 1991

[54] INTEGRATED MEDIA CARTRIDGE AND FILTER

[75] Inventors: Eric Walowit, Springboro; Gregory J. Sexton, Dayton, both of Ohio

[73] Assignee: The Mead Corporation, Dayton, Ohio

[21] Appl. No.: 446,367

[22] Filed: Dec. 5, 1989

[51] Int. Cl.$^5$ .............................................. B01D 50/00
[52] U.S. Cl. ...................................... 55/385.1; 55/490
[58] Field of Search ....................... 55/385.1, 490, 495

[56] References Cited

U.S. PATENT DOCUMENTS

| 2,279,553 | 4/1942 | Bradt | 55/385.1 X |
|---|---|---|---|
| 3,062,110 | 11/1962 | Shepardson et al. | 55/385.1 X |
| 3,570,224 | 3/1971 | Clemens | 55/385.1 X |
| 3,680,528 | 8/1972 | Sanders | 55/385.1 X |
| 3,894,514 | 7/1975 | Caudill et al. | 55/385.1 X |
| 4,399,209 | 8/1983 | Sanders et al. | 430/138 |
| 4,440,846 | 4/1984 | Sanders et al. | 430/138 |
| 4,678,489 | 7/1987 | Bertelsen | 55/418 |
| 4,878,581 | 11/1989 | Beery | 06/416 |

OTHER PUBLICATIONS

Research Disclosure No. 301118 entitled, "A Method and System of Assuring Filter Changes in an Unmonitored Enrivonment", dated May 1989.

Primary Examiner—Richard L. Chiesa
Attorney, Agent, or Firm—Biebel, French & Nauman

[57] ABSTRACT

A cartridge or cassette of web-type media material for delivery to utilization apparatus, such as a photocopier system, incorporates a filter which is integrated into the cartridge for filtering or absorbing fumes or gasses generated by the processing of the media material. The filter is automatically replaced and changed with the replacement of the cartridge.

6 Claims, 5 Drawing Sheets

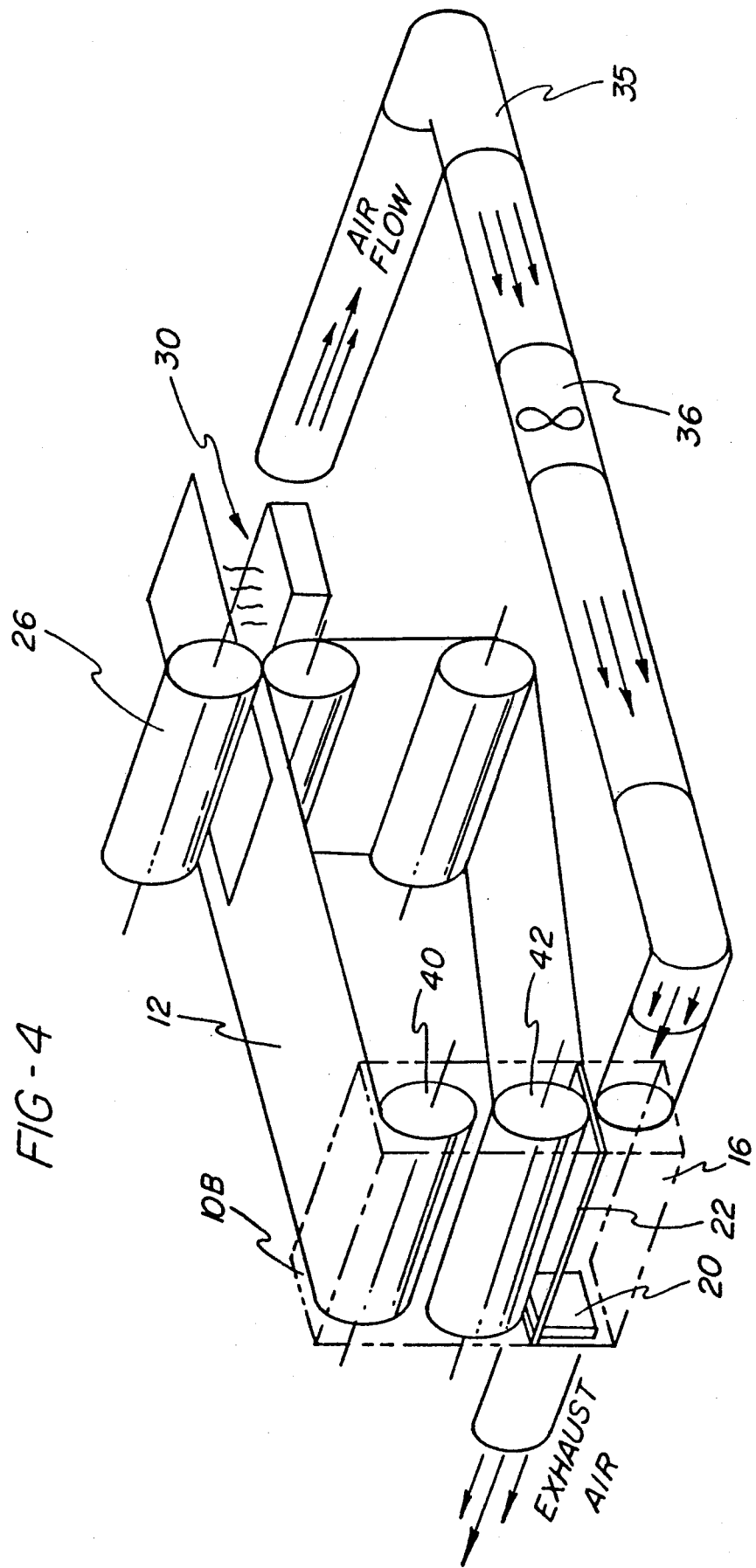

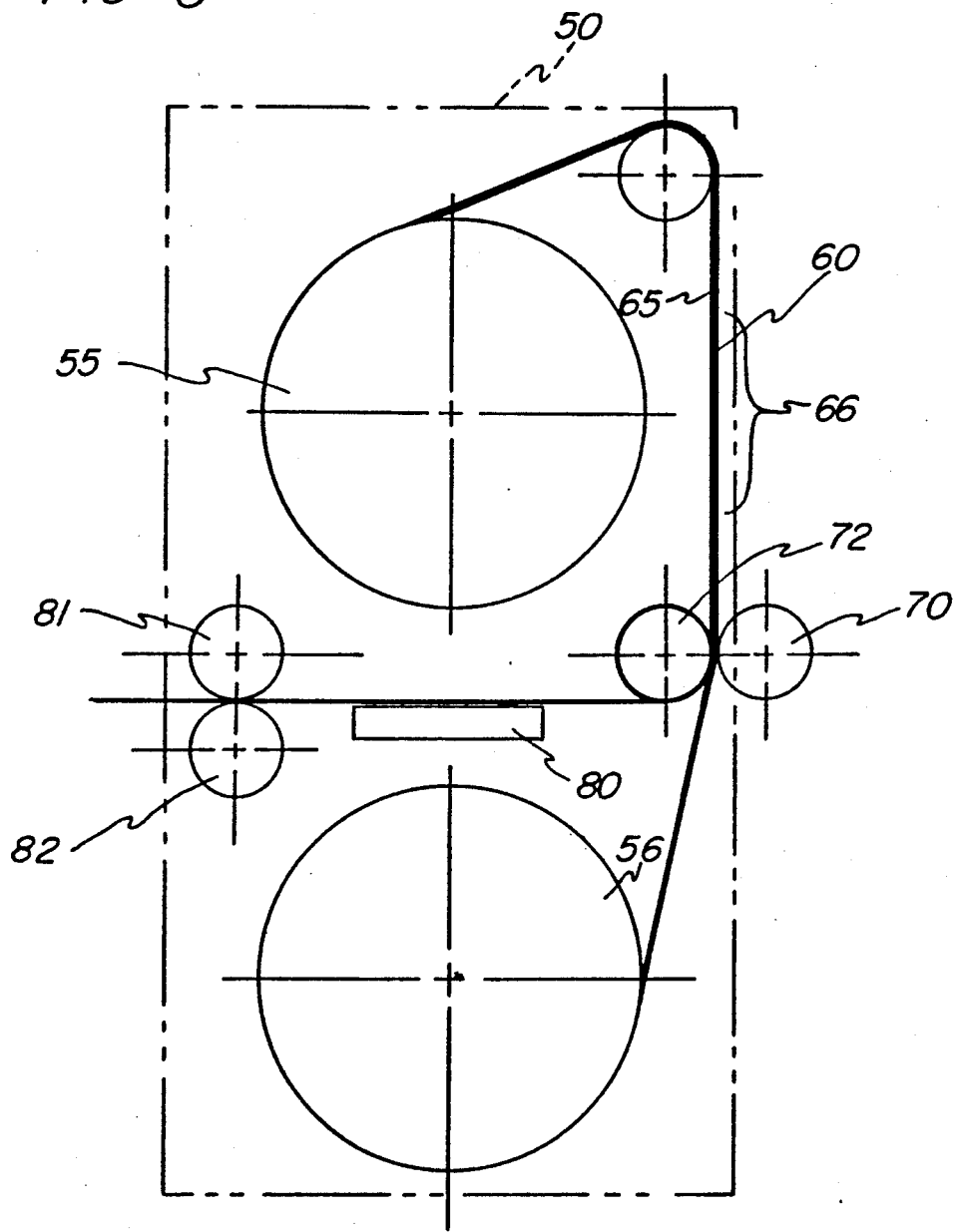

INTEGRATED MEDIA CARTRIDGE AND FILTER

BACKGROUND OF THE INVENTION

This invention relates to media material processing, and more particularly to processing apparatus, methods and systems, in which a media material, or several such materials, are supplied by a cartridge or cassette of such material in utilization apparatus, where the material, which may be supplied in web and/or sheet form is treated and/or action upon, such as by heat, light and/or pressure, and in which the fumes generated by the process are subjected to filtration to render them environmentally acceptable. Such apparatus may conventionally have an air processing system, including a changeable filter element.

The filters for such purposes can have a finite life due to a number of factors or combination of factors, including the total amount of material processed, the time which the filter has been in the apparatus, and the environment in which the machine is operated. In a paper copier apparatus, these factors may also include the gloss level, type of material and throughput rate, and the exposure level.

In such systems and apparatus, where the service to the machine is controlled on a regular basis, usually no problem arises since the filter is changed on a timely basis. On the other hand, advances in technology has provided apparatus with high reliability, so that frequent or regular service is not required. A user may not wish to have a maintenance contract, or the cost associated with a service person changing filters on a timely basis.

Because of the need to monitor filter life, and to change the filter before it becomes saturated or inefficient, various schemes have been suggested to alert the operator of such need. These includes filters which are, in effect, self monitoring, and which alert the operator and/or shut down the apparatus an appropriate time. In the case of a copier, the filer can count the number of cycles or copies, or can monitor its internal condition.

Such sophisticated monitoring or counting systems are costly, are subject to failure, and in any case even when working properly, require special and often unanticipated and unwanted attention of the operator, to remove the older filter and install a new one. Obviously, this can occur at inconvenient times.

However, there is one inherent characteristic of the cartridge of cassette loaded machine, and that is the necessity of changing the cartridge when empty or spent of its contents.

SUMMARY OF THE INVENTION

The present invention solves the filter monitoring and changing problem, by integrating the filter with the supply cartridge or cassette. It is, in fact, "transparent" to the user in that he does not see it and does not have to deal with it. Also, such filter, is by design, sufficient to treat the fumes from the processing of the quantity of media material in the cartridge, and this is automatically changed when a depleted cartridge is replaced. Throughout this application, the terms "cartridge" is intended to include either single or multiple spool containers, although the latter are more frequently referred to as cassettes.

The integrated cartridge and filter eliminates the waste of too frequent filter replacement, permits the optimization of the quantity of filtering material in relation to the quantity of material to be processed, and removes the risk that an attendant operator would fail to change a filter after it has become spent. Where a given cartridge or cartridge design is capable of use on more than one utilization apparatus, or when a given cartridge is designed to contain more than one type or quantity of material, the integrated filter/media cartridge of this invention permits the tailoring of the filter to the contents and/or the particular apparatus. Such tailoring may be by material content, volume, air flow rate, shape, or any combination of these.

A further advantage of the invention resides in the fact that the cartridge/filter replaces a much higher capacity stand alone or individual equipment filter. In those instances where the filter is required to capture and retain noxious and possible harmful or toxic substances, the disposal of a filter which contains only a comparatively small quantity of such substance presents less of a control problem than does the disposal of the large capacity filter which could contain a much larger quantity of such substance.

In the practice of the invention, the filter itself is preferable isolated from the media material contained in the cartridge or cassette. The spool of media material in the cartridge should be protected from both direct contact with the fumes being filtered and from the heat of the gasses, where such gasses are caused as a result of the heating of one or more components of the material being processed. Usually, the gasses from the developer stage and from the heated glossing stages are processed by delivery to a filter. In some instances, the utilization apparatus originally used separate filters for this purpose, and it is an object of the invention to simplify such arrangements by the use of a single filter inserted and removed as a part of the media cartridge.

In copying apparatus, the fumes or process gasses are usually collected at the developer stage and the glossing stage for delivery for treatment by a filter. With the integrated filter/cartridge of this invention, the fumes are delivered instead to the cartridge for processing by the cartridge-contained filter before venting into the room or environment. In some systems, such as where separate donor web and receiver web or sheets are used, the spent donor web is spooled into an empty cartridge, and it may be this receiver cartridge which is supplied with an integrated filter. In this instance, it is not necessary to build isolation or protection into the cartridge, to protect the web media material from the effects of contact with the processing gasses since the donor web is already spent.

The invention is not intended to be limited to cartridges which have integrated filters. Such cartridges may integrate other portions or function normally associated with the processing apparatus, such as a portion of the pressure developer in the case of microencapsulated media material, and the glosser. While this would increase the cost of the cartridge (or cassette), it would permit the original equipment to be offered at a lower initial cost. The design of such additional components or portions takes into account the fact that only a finite amount of material must be processed, thus permitting the use of lower cost components as compared to corresponding permanent components in original equipment.

It is therefore an important object of this invention to provide a copying system or apparatus, and a media material cartridge apparatus for such apparatus, in which the cartridge itself contains a filter for handling the process fumes and gasses associated with the media material.

Another object of the invention is the provision of a sheet or web-type media supplying and/or take-up cartridge which incorporates a filter, which filter is proportioned in capacity to eliminate or neutralize undesirable or noxious fumes which may be created in the processing of the media material contained in the cartridge.

A still further object of the invention is the provision of a cartridge which is self-contained in that components normally contained within the processing apparatus itself are contained within the cartridge, for renewal with cartridge replacement.

These and other objects and advantages of the invention will be apparent from the following description, the accompanying drawings and the appended claims.

BRIEF DESCRIPTION OF THE DRAWINGS

FIG. 4 is a further diagrammatic view of utilization apparatus incorporating a two-spool cartridge or cassette in accordance with this invention; and FIG. 5 is a side diagrammatic view of a further embodiment of a cartridge according to this invention incorporating additional components utilized in the processing of web or sheet-type media material.

DESCRIPTION OF PREFERRED EMBODIMENTS

Figure 1:
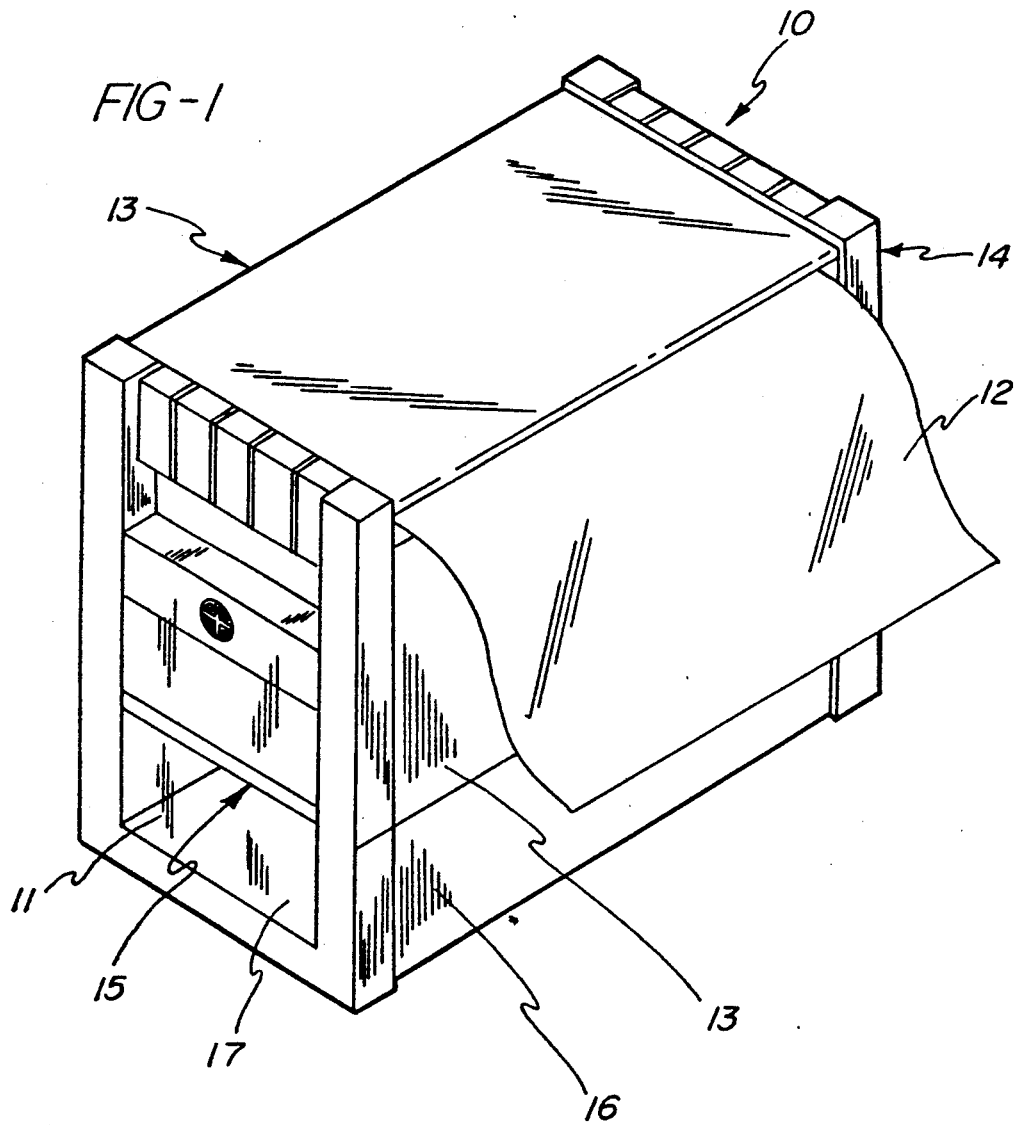
FIG. 1 is a perspective view of a typical cartridge in accordance with this invention.

Referring to the figures of the drawing, which illustrate preferred embodiments of the invention, a typical cartridge for containing and delivering a quantity of web-type media material is illustrated generally at 10 in FIG. 1. For example, the media material 12 dispensed by the cartridge in a utilization apparatus or system may comprise a donor web having an imaging layer which includes a photosensitive layer including microcapsules made in accordance with the teachings of U.S. Pat. Nos. 4,440,846 and 4,399,209.

For the sake of economy of manufacture, the cartridge housing or body generally consists of an intermediate body 13 of folded board material, closed by a pair of end caps 14 and 15. The body 13 and the end caps 14 and 15 enclose and contain an internal spool of the web material 12 for delivery to the utilization apparatus, in this instance a photocopying machine.

The cartridge 10 of this invention is intended to be inserted into utilization apparatus of the kind in which processing fumes, caused by the processing of the media material, is collected and directed to a filter before being returned to the environment, for the capture and collection of undesirable or noxious components in the fumes and gasses.

Integrated with the cartridge 10 is an air filtration portion 16 formed as an integral part of the cartridge. The air filtration portion 16 may be formed as a physical extension of the cartridge body and includes an air inlet 17 formed in the end wall 15 leading to a filter 20 (not shown in FIG. 1) to an identical air exit opening (not shown) in the opposite end wall 14. The inlet and exit openings line up with corresponding ducts in the utilization apparatus, when the cartridge 10 is installed.

Figure 2:
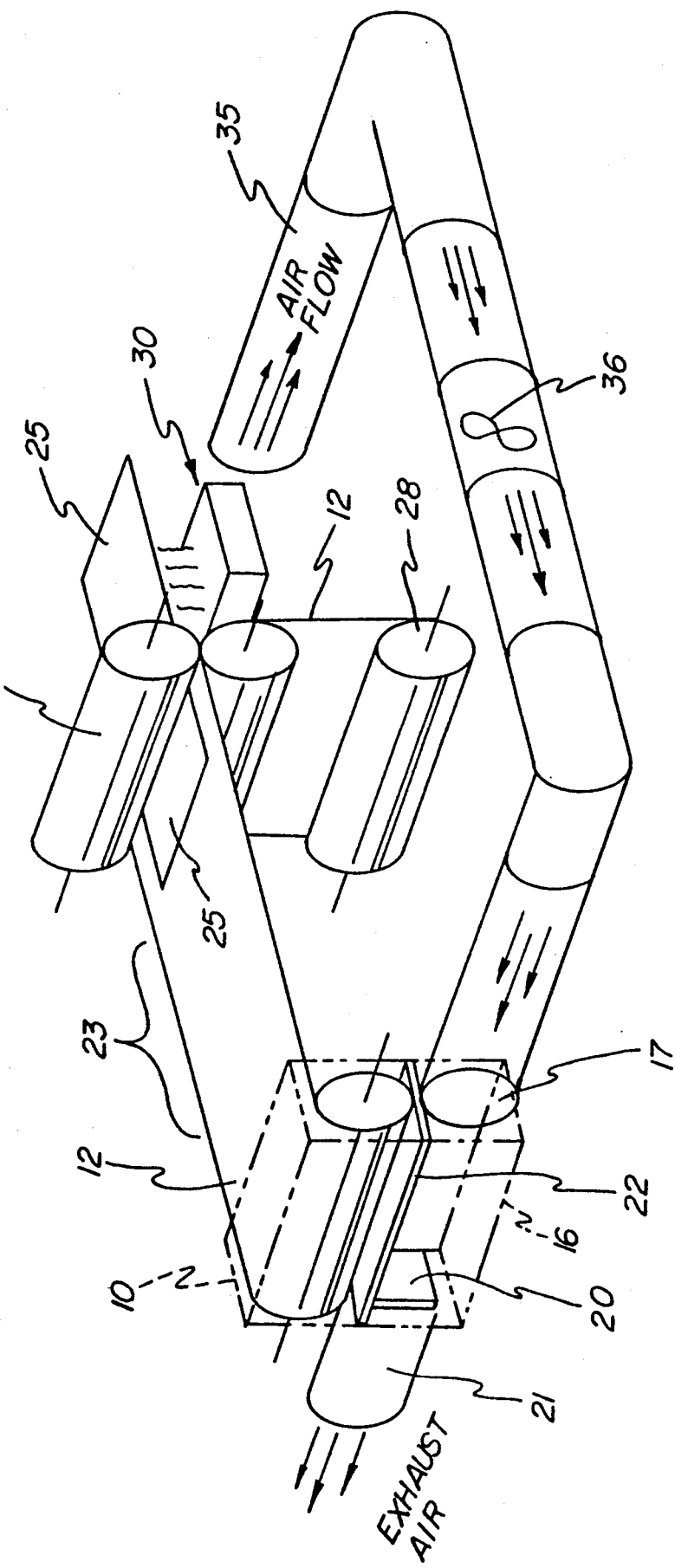
FIG. 2 diagrammatically illustrates the use of the cartridge of FIG. 1 in utilization apparatus in the form of a copy machine.

FIG. 2 illustrates the incorporation of the cartridge 10 in typical utilization apparatus, diagrammatically showing the path of movement of the media material 12 from the cartridge 10, and the flow of air through the cartridge from the inlet 17, through the passageway defined in the filter portion 16 to the filter 20 and to an outlet duct 21.

A barrier 22 separates and isolates the filter portion 16 from the remainder of the cartridge and particularly from the contained spool of media material. The barrier 22 forms part of the enclosing walls of the conduit, and also prevents undue heat from the processing gases to effect the spooled material.

FIG. 2 further illustrates the movement of the donor sheet or web 12 to an exposure station 23, where receiver sheets 25 are applied in the form of individual sheets or a web, to the donor web 12. After exposure, the two webs or sheets move together through a pair of pinch rolls or developer rolls, in which the microcapsulates are subject to controlled rupturing pressure, as taught in the above-identified patents. From the developer rolls 26, the spent donor web 12 moves down to a rewind or take-up spool 28, while the receiver sheets 25 move to a glosser station 30.

The receiver sheets 25 typically are formed with a resin coating which must be transparentized or glossed in a glossing station, commonly by applying heat and pressure to the resin surface. A certain amount of offgassing occurs during the processing, at the developer station defined by the developer rolls 26 and at the glossing station defined by the glosser 30, and typical utilization apparatus is formed with hood collection means by which the process gases are delivered to an absorption filter before being returned to the outside environment of the apparatus.

In this invention, these gases are returned directly to the cartridge 10 by an air duct 35, the air flow being augmented or caused by a blower 36 in the duct 35 for delivery of such gases to the gas or air inlet 17.

Figure 3:
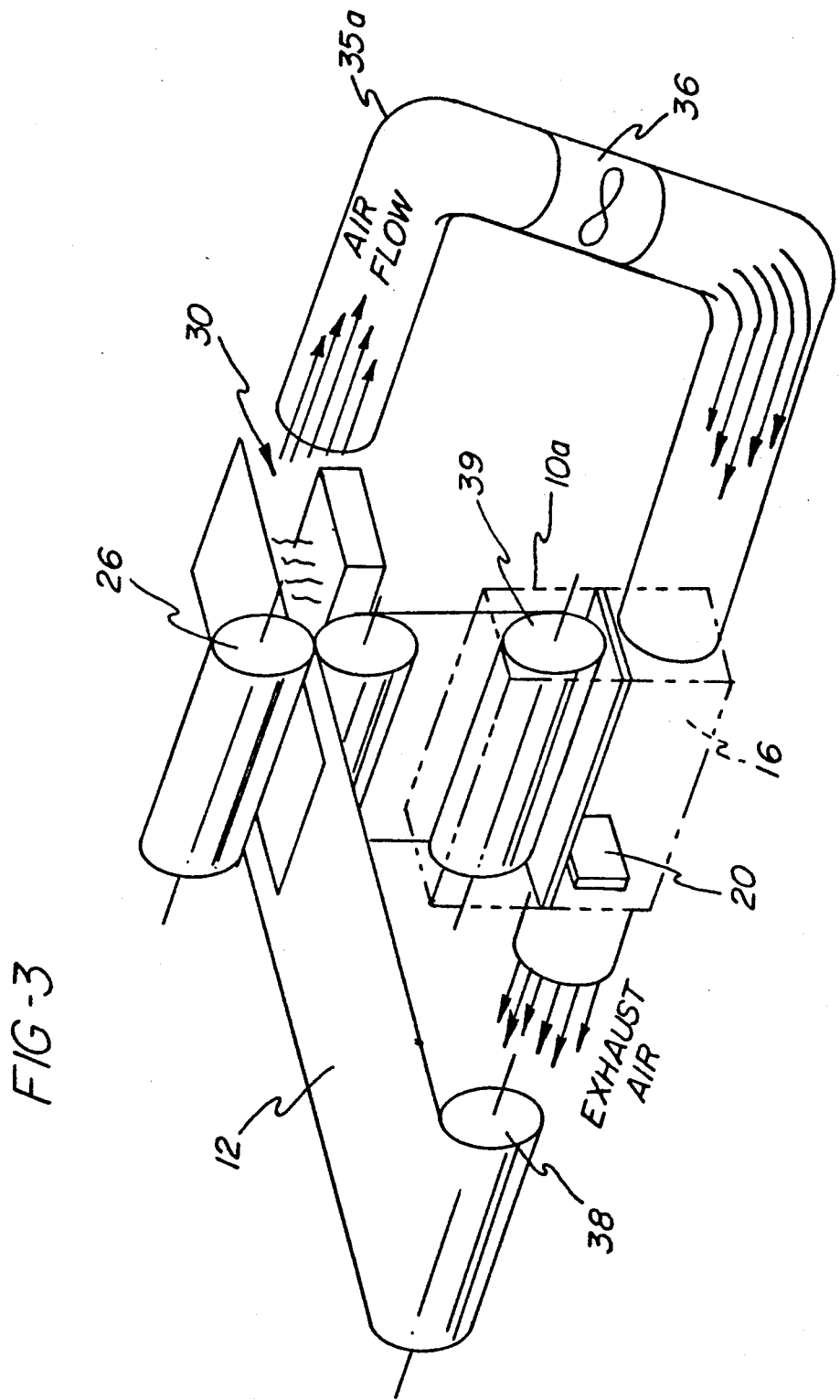
FIG. 3 is a further diagrammatic view of utilization apparatus incorporating a rewind cartridge according to this invention.

FIG. 3 illustrates a modified form of the invention in which the cartridge 10a is used exclusively as a take-up spool for the spent donor web. In the utilization apparatus embodiment of FIG. 3, like parts are represented by like reference numerals.

It will be seen that the donor media is delivered from a spool 38 which may or may not be contained in a cartridge. Preferably, a cartridge is employed, but for the sake of simplicity, is not shown. The spent donor web is delivered from the developer rolls 26 to the take-up spool 39 of a take-up cartridge 10a. Again, the process fumes collected from the developer rolls and from the glossing station are returned through a conduit 35a for delivery to the cartridge filter 20.

In the case of the cartridge 10a, it is not necessary to isolate the processing gases or the heat of such gases from the media material, as in the case of the cartridge 10, since the donor web is spent and need not be protected from the effects of such heat or contamination.

In the embodiment of FIG. 4, a more complex cartridge 10b is illustrated, commonly referred to as a cassette, as it contains more than one spool. In this case, the cartridge 10b includes both the spool 40 of the donor material 12, and also a rewind or take-up spool 42 for the spent donor material. Since the donor and receiver spools are closely associated within the cartridge 10b, the air filter duct portion 16 is preferably environmentally isolated by the internal baffle and barrier 22 as previously described in connection with FIG. 2.

In the several illustrative embodiments of the invention of FIGS. 1-4, it will be seen that a filter 20 is positioned within a duct portion 16 which is integrated with the cartridge and which duct portion is accurately aligned in position when the cartridge is properly inserted in the utilization apparatus. The filer 20, which may contain a suitable absorbent material, in accordance with the character of the processing gases, is provided with a useful capacity directly related to the quantity of the media material 12 to be processed by the utilization apparatus. The replacement of a spent cartridge 10 automatically places a fresh filter in line. This eliminates the possibility that the utilization apparatus would be allowed to operate with a spent or saturated filter.

As previously noted, it is within the scope of this invention to incorporate other components usually limited to the utilization apparatus, in the replaceable cartridge or cassette, for periodic renewal, with the replacement of the cartridge, and for lowering the cost of the equipment involved. One such cartridge is illustrated generally at 50 in FIG. 5 as including a spool 55 of media material, and a take-up spool 56. In this instance, the delivery or supply spool 55 may contain a sandwich of face-up donor material 60 with a clear base and a face-down receiver 65, with the receiver carried on the inside surface of the donor. This sandwich of face-up donor material with a clear base and face-down receiver, contained in a single cartridge 50, provides several advantages. First, separate donor and delivery means are not required, and thus the loading of the receiver material is performed simultaneously with the loading of the donor material. The donor 60 may be easily exposed through the backside of the donor clear base, and a white receiver web 65 may be used to reflect back light to provide additional exposure. An exposure station is diagrammatically illustrated at 66, which may take the form of an exposure slit. Alternatively, the composite web may be extracted from the cartridge 50 for exposure at an exposure station and returned to the cartridge.

In the improved cartridge of FIG. 5, the sandwich or composite is applied to developer rolls, including an external pressure roll 70 and an internal pressure roll 72. The external roll 70 is proportioned to engage the internal roll 72 through a suitable slot or opening formed in the case or wall of the cartridge 50, and to apply the necessary developing pressure to the material. Thereafter, the donor web 60 is taken up by the take-up spool 56, while the receiver web 65 may pass through a chemical glosser 80 and through a pair of feed rolls 82 to exit the cartridge. In addition to the components shown, an integrated filter system, formed integrally with the cartridge 50, would be employed in the manner substantially as shown in the preceding embodiments.

The cartridge 50 illustrates the economies which can be effected by incorporating additional processing components in the cartridge and tailoring such components to have a useful life commensurate with the quantity of material to be processed. For example, the developer pressure roll 72, integral and internal to the cartridge 40, is positioned to operate against a single external high quality developer pressure roll 70 of the utilization apparatus. Accordingly the internal roll 72 need not be of a high price material and is designed to provide reliable operation only for the material within the cassette.

The internal chemical glosser 80 offers the advantage that the glossing fumes, if any, can be controlled and filtered at the source, and the glosser 80 need not have an effective capacity substantially in excess of the amount of material to be treated. Thus, by incorporating some of the critical apparatus components into the cartridge itself, the processing apparatus may be supplied at a substantially lower going-in cost.

The operation of the invention as applied to each of the embodiments is largely self-evident from the foregoing descriptions. The incorporation of the filter portion 16 in the cartridge or cassette 10 and 50 assures the proper maintenance of the filter and in effect makes the filter "transparent" to the operator. Similarly, the incorporation of other useful components in the cartridge 50, including a portion of the pressure developer and including the glosser, makes these parts expendable and similarly "transparent" to the operator, and permits the manufacture of utilization apparatus of an initially lower cost.

While the forms of apparatus herein described constitute preferred embodiments of this invention, it is to be understood that the invention is not limited to these precise forms of apparatus, and that changes may be made therein without departing from the scope of the invention which is defined in the appended claims.

What is claimed is:

1. In apparatus for the processing of sheet or web media material, in which the material is supplied to the apparatus in a replaceable cartridge, the improvement comprising a filter for treating gasses formed during the processing of said material in said apparatus, said filter formed as an integrated part of said cartridge and having a capacity related to the quantity of said media material contained in said cartridge, means in said apparatus for the delivery of processing gasses to said cartridge for filtering by said filter, means in said cartridge for isolating said media material from contact with and the heat of said gasses, and means in said apparatus for receiving filtered air from said filter.

2. An improved cartridge for the supply of a web or sheet media material to utilization apparatus in which the processing of said material results in the formation of process fumes which are controlled by filtration, comprising a housing, a supply of said media material in said housing positioned for delivery therefrom to said utilization apparatus, a fume filter in said housing, said filter having a capacity sufficient to filter the fumes formed by said supply of media material, means in said housing defining a gas passage for connecting said filter to a supply of said gas containing said fumes delivered thereto by said apparatus, means in said housing isolating said gasses from said material to prevent damage to said material, and means in said housing forming a filter outlet for the discharge of filtered gasses therefrom.

3. In a cartridge having an enclosing housing and containing at least one spool for the storage of web material thereon, and in which process fumes are formed during the processing of said material in utilization apparatus into which the cartridge is inserted in use, and in which said apparatus includes fume collection ducting, the improvement comprising a fume processing filter in said cartridge housing, said filter having a capacity to filter the fumes caused by the processing of said material carried on said spool, means in said cartridge housing for accepting fumes from said ducting and directing said fumes to said filter.

4. The cartridge of claim 3 in which said spool contains a quantity of unprocessed said web material.

5. The cartridge of claim 3 in which said spool is empty and is positioned to receive said web material after it has been processed in said apparatus.

6. In a system for the processing of web or sheet media material under heat and pressure, and in which a significant portion of the media material processed in said system is supplied in the form of a cartridge of said material loaded into said system, and in which the fumes generated by said processing are collected for delivery to a filter, the improvement comprising a fume processing filter formed as an integrated part of said cartridge so that the filter is changed with the replacement of the cartridge, and means delivering said process fumes to said filter when said cartridge is loaded in said system.

* * * * *